(12) United States Patent  
Sheydayi

(10) Patent No.: US 7,001,468 B1  
(45) Date of Patent: Feb. 21, 2006

(54) PRESSURE ENERGIZED PRESSURE VESSEL OPENING AND CLOSING DEVICE AND METHOD OF PROVIDING THEREFOR

(75) Inventor: Alexei Sheydayi, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 203 days.

(21) Appl. No.: 10/353,192

(22) Filed: Jan. 27, 2003

Related U.S. Application Data

(60) Provisional application No. 60/357,763, filed on Feb. 15, 2002.

(51) Int. Cl.
*C23C 16/00* (2006.01)
*C23F 1/00* (2006.01)
*B65D 53/00* (2006.01)

(52) U.S. Cl. .................. 118/733; 118/718; 118/719; 156/345.31; 220/240

(58) Field of Classification Search ............... 118/733; 220/240
See application file for complete search history.

(56) References Cited

U.S. PATENT DOCUMENTS

| | | |
|---|---|---|
| 2,617,719 A | 11/1952 | Stewart |
| 2,625,886 A | 1/1953 | Browne |
| 2,873,597 A | 2/1959 | V. T. Fahringer |
| 3,521,765 A | 7/1970 | R. D. Kauffman |
| 3,623,627 A * | 11/1971 | Bolton ..................... 220/252 |
| 3,689,025 A | 9/1972 | Kiser |
| 3,744,660 A | 7/1973 | Gaines et al. |
| 3,968,885 A | 7/1976 | Hassan et al. |
| 4,029,517 A | 6/1977 | Rand |
| 4,091,643 A | 5/1978 | Zucchini |
| 4,245,154 A | 1/1981 | Uehara et al. |
| 4,341,592 A | 7/1982 | Shortes et al. |
| 4,355,937 A | 10/1982 | Mack et al. |
| 4,367,140 A | 1/1983 | Wilson |
| 4,391,511 A | 7/1983 | Akiyama et al. |
| 4,406,596 A | 9/1983 | Budde |
| 4,422,651 A | 12/1983 | Platts |
| 4,426,358 A * | 1/1984 | Johansson ................ 422/112 |

(Continued)

FOREIGN PATENT DOCUMENTS

| | | |
|---|---|---|
| CH | SE 251213 | 8/1948 |

(Continued)

OTHER PUBLICATIONS

Hideaki Itakura et al., "Multi-Chamber Dry Etching System", Solid State Technology, Apr. 1982, pp. 209-214.

(Continued)

*Primary Examiner*—Parviz Hassanzadeh
*Assistant Examiner*—Karla Moore
(74) *Attorney, Agent, or Firm*—Haverstock & Owens LLP

(57) ABSTRACT

A closure assembly coupled to a vessel including a chamber and an access port in communication with the chamber, the closure assembly comprising: a door assembly coupled to the vessel and configured to move between an open position and a closed position, the door assembly in contact with the access port at a first location thereby sealing the chamber in the closed position, wherein pressure within the chamber applies a force to the door assembly at the first location. An actuator in moveable contact with the door assembly at a second location, the actuator configured to apply a counter-acting force to the door assembly at the second location in response to pressure within the chamber to maintain the door assembly in the closed position. The actuator moves between a non-actuated and actuated position within an actuator bore, the actuator in the actuated position when a desired amount of pressure is applied to the actuator bore.

24 Claims, 6 Drawing Sheets

U.S. PATENT DOCUMENTS

| | | | |
|---|---|---|---|
| 4,474,199 A | 10/1984 | Blaudszun | |
| 4,522,788 A | 6/1985 | Sitek et al. | |
| 4,549,467 A | 10/1985 | Wilden et al. | |
| 4,574,184 A | 3/1986 | Wolf et al. | |
| 4,592,306 A | 6/1986 | Gallego | |
| 4,601,181 A | 7/1986 | Privat | |
| 4,626,509 A | 12/1986 | Lyman | |
| 4,670,126 A | 6/1987 | Messer et al. | |
| 4,682,937 A | 7/1987 | Credle, Jr. | |
| 4,693,777 A | 9/1987 | Hazano et al. | |
| 4,749,440 A | 6/1988 | Blackwood et al. | |
| 4,778,356 A | 10/1988 | Hicks | |
| 4,788,043 A | 11/1988 | Kagiyama et al. | |
| 4,789,077 A | 12/1988 | Noe | |
| 4,823,976 A | 4/1989 | White, III et al. | |
| 4,825,808 A | 5/1989 | Takahashi et al. | |
| 4,827,867 A | 5/1989 | Takei et al. | |
| 4,838,476 A | 6/1989 | Rahn | |
| 4,865,061 A | 9/1989 | Fowler et al. | |
| 4,879,431 A | 11/1989 | Bertoncini | |
| 4,917,556 A | 4/1990 | Stark et al. | |
| 4,924,892 A | 5/1990 | Kiba et al. | |
| 4,951,601 A | 8/1990 | Maydan et al. | |
| 4,960,140 A | 10/1990 | Ishijima et al. | |
| 4,983,223 A | 1/1991 | Gessner | |
| 5,011,542 A | 4/1991 | Weil | |
| 5,044,871 A | 9/1991 | Davis et al. | |
| 5,062,770 A | 11/1991 | Story et al. | |
| 5,071,485 A | 12/1991 | Matthews et al. | |
| 5,105,556 A | 4/1992 | Kurokawa et al. | |
| 5,143,103 A | 9/1992 | Basso et al. | |
| 5,167,716 A | 12/1992 | Boitnott et al. | |
| 5,169,296 A | 12/1992 | Wilden | |
| 5,169,408 A | 12/1992 | Biggerstaff et al. | |
| 5,185,296 A | 2/1993 | Morita et al. | |
| 5,186,594 A | 2/1993 | Toshima et al. | |
| 5,186,718 A | 2/1993 | Tepman et al. | |
| 5,188,515 A | 2/1993 | Horn | |
| 5,190,373 A | 3/1993 | Dickson et al. | |
| 5,191,993 A | 3/1993 | Wanger et al. | |
| 5,193,560 A | 3/1993 | Tanaka et al. | |
| 5,195,878 A | 3/1993 | Sahiavo et al. | |
| 5,213,485 A | 5/1993 | Wilden | |
| 5,217,043 A | 6/1993 | Novakovi | |
| 5,221,019 A | 6/1993 | Pechacek | |
| 5,222,876 A | 6/1993 | Budde | |
| 5,224,504 A | 7/1993 | Thompson et al. | |
| 5,236,669 A | 8/1993 | Simmons et al. | |
| 5,237,824 A | 8/1993 | Pawliszyn | |
| 5,240,390 A | 8/1993 | Kvinge et al. | |
| 5,243,821 A | 9/1993 | Schuck et al. | |
| 5,246,500 A | 9/1993 | Samata et al. | |
| 5,251,776 A | 10/1993 | Morgan, Jr. et al. | |
| 5,267,455 A | 12/1993 | Dewees et al. | |
| 5,280,693 A | 1/1994 | Heudecker | |
| 5,285,352 A | 2/1994 | Pastore et al. | |
| 5,288,333 A | 2/1994 | Tanaka et al. | |
| 5,313,965 A | 5/1994 | Palen | |
| 5,314,574 A | 5/1994 | Takahashi | |
| 5,328,722 A | 7/1994 | Ghanayem et al. | |
| 5,337,446 A | 8/1994 | Smith et al. | |
| 5,339,844 A | 8/1994 | Stanford, Jr. et al. | |
| 5,355,901 A | 10/1994 | Mielnik et al. | |
| 5,368,171 A | 11/1994 | Jackson | |
| 5,370,741 A | 12/1994 | Bergman | |
| 5,374,829 A | 12/1994 | Sakamoto et al. | |
| 5,377,705 A | 1/1995 | Smith, Jr. et al. | |
| 5,401,322 A | 3/1995 | Marshall | |
| 5,404,894 A | 4/1995 | Shiraiwa | |
| 5,412,958 A | 5/1995 | Iliff et al. | |
| 5,417,768 A | 5/1995 | Smith, Jr. et al. | |
| 5,433,334 A | 7/1995 | Reneau | |
| 5,447,294 A | 9/1995 | Sakata et al. | |
| 5,474,410 A | 12/1995 | Ozawa et al. | |
| 5,503,176 A | 4/1996 | Dunmire et al. | |
| 5,505,219 A | 4/1996 | Lansberry et al. | |
| 5,509,431 A | 4/1996 | Smith, Jr. et al. | |
| 5,526,834 A | 6/1996 | Mielnik et al. | |
| 5,533,538 A | 7/1996 | Marshall | |
| 5,571,330 A | 11/1996 | Kyogoku | |
| 5,589,224 A | 12/1996 | Tepman et al. | |
| 5,621,982 A | 4/1997 | Yamashita et al. | |
| 5,629,918 A | 5/1997 | Ho et al. | |
| 5,644,855 A | 7/1997 | McDermott et al. | |
| 5,649,809 A | 7/1997 | Stapelfeldt | |
| 5,656,097 A | 8/1997 | Olesen et al. | |
| 5,669,251 A | 9/1997 | Townsend et al. | |
| 5,672,204 A | 9/1997 | Habuka | 117/204 |
| 5,679,169 A | 10/1997 | Gonzales et al. | |
| 5,702,228 A | 12/1997 | Tamai et al. | |
| 5,706,319 A | 1/1998 | Holtz | |
| 5,746,008 A | 5/1998 | Yamashita et al. | |
| 5,769,588 A | 6/1998 | Toshima et al. | |
| 5,797,719 A | 8/1998 | James et al. | |
| 5,798,126 A | 8/1998 | Fijikawa et al. | |
| 5,817,178 A | 10/1998 | Mita et al. | 118/666 |
| 5,879,459 A | 3/1999 | Gadgil et al. | |
| 5,881,577 A | 3/1999 | Sauer et al. | |
| 5,882,165 A | 3/1999 | Maydan et al. | |
| 5,888,050 A | 3/1999 | Fitzgerald et al. | |
| 5,898,727 A | 4/1999 | Fujikawa et al. | |
| 5,900,107 A | 5/1999 | Murphy et al. | |
| 5,904,737 A | 5/1999 | Preston et al. | |
| 5,906,866 A | 5/1999 | Webb | |
| 5,928,389 A | 7/1999 | Jevtic | |
| 5,932,100 A | 8/1999 | Yager et al. | |
| 5,934,856 A | 8/1999 | Asakawa et al. | |
| 5,934,991 A | 8/1999 | Rush | |
| 5,975,492 A | 11/1999 | Brenes | |
| 5,979,306 A | 11/1999 | Fujikawa et al. | |
| 5,980,648 A | 11/1999 | Adler | |
| 5,981,399 A | 11/1999 | Kawamura et al. | |
| 5,989,342 A | 11/1999 | Ikeda et al. | |
| 6,005,226 A | 12/1999 | Aschner et al. | |
| 6,017,820 A | 1/2000 | Ting et al. | |
| 6,021,791 A | 2/2000 | Dryer et al. | |
| 6,029,371 A | 2/2000 | Kamikawa et al. | |
| 6,035,871 A | 3/2000 | Eui-Yeol | |
| 6,037,277 A | 3/2000 | Masakara et al. | |
| 6,048,494 A * | 4/2000 | Annapragada | 422/33 |
| 6,053,348 A | 4/2000 | Morch | |
| 6,056,008 A | 5/2000 | Adams et al. | |
| 6,062,853 A | 5/2000 | Shimazu et al. | |
| 6,067,728 A | 5/2000 | Farmer et al. | |
| 6,077,053 A | 6/2000 | Fujikawa et al. | |
| 6,077,321 A | 6/2000 | Adachi et al. | |
| 6,082,150 A | 7/2000 | Stucker | |
| 6,085,935 A | 7/2000 | Malchow et al. | |
| 6,089,377 A | 7/2000 | Shimazu | |
| 6,097,015 A | 8/2000 | McCullough et al. | |
| 6,109,296 A | 8/2000 | Austin | |
| 6,122,566 A | 9/2000 | Nguyen et al. | |
| 6,128,830 A | 10/2000 | Bettcher et al. | |
| 6,145,519 A | 11/2000 | Konishi et al. | |
| 6,159,295 A | 12/2000 | Maskara et al. | |
| 6,164,297 A | 12/2000 | Kamikawa | |
| 6,186,722 B1 | 2/2001 | Shirai | |
| 6,203,582 B1 | 3/2001 | Berner et al. | |
| 6,216,364 B1 | 4/2001 | Tanaka et al. | |
| 6,228,563 B1 | 5/2001 | Starov et al. | |
| 6,235,634 B1 | 5/2001 | White et al. | |
| 6,239,038 B1 | 5/2001 | Wen | |
| 6,241,825 B1 | 6/2001 | Wytman | |
| 6,244,121 B1 | 6/2001 | Hunter | |

| | | |
|---|---|---|
| 6,251,250 B1 | 6/2001 | Keigler |
| 6,277,753 B1 | 8/2001 | Mullee et al. |
| 6,286,231 B1 | 9/2001 | Bergman et al. |
| 6,305,677 B1 | 10/2001 | Lenz |
| 6,334,266 B1 | 1/2002 | Moritz et al. |
| 6,344,174 B1 | 2/2002 | Miller et al. |
| 6,355,072 B1 | 3/2002 | Racette et al. |
| 6,388,317 B1 | 5/2002 | Reese |
| 6,389,677 B1 | 5/2002 | Lenz |
| 6,406,782 B1 | 6/2002 | Johnson et al. |
| 6,418,956 B1 | 7/2002 | Bloom |
| 6,436,824 B1 | 8/2002 | Chooi et al. |
| 6,454,519 B1 | 9/2002 | Toshima et al. |
| 6,454,945 B1 | 9/2002 | Weigl et al. |
| 6,464,790 B1 | 10/2002 | Shertinsky et al. |
| 6,465,403 B1 | 10/2002 | Skee |
| 6,508,259 B1 | 1/2003 | Tseronis et al. ............ 134/105 |
| 6,509,141 B1 | 1/2003 | Mullee |
| 6,521,466 B1 | 2/2003 | Castrucci |
| 6,541,278 B1 | 4/2003 | Morita et al. |
| 6,546,946 B1 | 4/2003 | Dunmire |
| 6,550,484 B1 | 4/2003 | Gopinath et al. |
| 6,558,475 B1 | 5/2003 | Jur et al. |
| 6,561,213 B1 | 5/2003 | Wang et al. |
| 6,561,220 B1 | 5/2003 | McCullough et al. |
| 6,561,481 B1 | 5/2003 | Filonczuk |
| 6,561,767 B1 | 5/2003 | Berger et al. |
| 6,564,826 B1 | 5/2003 | Shen |
| 6,635,565 B1 | 10/2003 | Wu et al. |
| 6,641,678 B1 | 11/2003 | DeYoung et al. |
| 6,722,642 B1 | 4/2004 | Sutton et al. |
| 6,921,456 B1 | 7/2005 | Biberger et al. |
| 2001/0050096 A1 | 12/2001 | Costantini et al. |
| 2002/0001929 A1 | 1/2002 | Biberger et al. |
| 2002/0046707 A1 | 4/2002 | Biberger et al. |
| 2002/0189543 A1 | 12/2002 | Biberger et al. |
| 2003/0205510 A1 | 11/2003 | Jackson |
| 2004/0020518 A1 | 2/2004 | DeYoung et al. |
| 2004/0157463 A1 | 8/2004 | Jones |
| 2005/0014370 A1 | 1/2005 | Jones |

FOREIGN PATENT DOCUMENTS

| | | |
|---|---|---|
| CN | 1399790 A | 2/2003 |
| DE | 36 08 783 A1 | 9/1987 |
| DE | 198 60 084 A1 | 7/2000 |
| EP | 0 244 951 A2 | 11/1987 |
| EP | 0 272 141 A2 | 6/1988 |
| EP | 0 453 867 A1 | 10/1991 |
| EP | 0 572 913 A1 | 12/1993 |
| EP | 0 587 168 A1 | 3/1994 |
| EP | 0 679 753 B1 | 11/1995 |
| EP | 0 903 775 A2 | 3/1999 |
| FR | 1.499.491 | 9/1967 |
| GB | 2 003 975 | 3/1979 |
| GB | 2 193 482 | 2/1988 |
| JP | 56-142629 | 11/1981 |
| JP | 60-238479 | 11/1985 |
| JP | 60-246635 | 12/1985 |
| JP | 61-231166 | 10/1986 |
| JP | 62-111442 | 5/1987 |
| JP | 62-125619 | 6/1987 |
| JP | 63-256326 | 10/1988 |
| JP | 63-303059 | 12/1988 |
| JP | 2-148841 | 6/1990 |
| JP | 2-209729 | 8/1990 |
| JP | 4-2484648- | 10/1992 |
| JP | 40 5283511 A | 10/1993 |
| JP | 8-186140 | 7/1996 |
| JP | 8-206485 | 8/1996 |
| JP | 10-144757 | 5/1998 |
| JP | 10-335408 | 12/1998 |
| JP | 11-200035 | 7/1999 |
| JP | 2000/106358 | 4/2000 |
| JP | 2001-77074 | 3/2001 |
| WO | WO 87/07309 | 12/1987 |
| WO | WO 91/12629 | 8/1991 |
| WO | WO 99/18603 | 4/1999 |
| WO | WO 00/36635 | 6/2000 |
| WO | WO 01/10733 A1 | 2/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A3 | 12/2001 |
| WO | WO 02/16051 A2 | 2/2002 |
| WO | WO 03/030219 A2 | 10/2003 |

OTHER PUBLICATIONS

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Courtecuisse, V.G. et al., Kinetics of the Titanium Isopropoxide Decomposition in Supercritical Isopropyl Alcohol, Ind. Eng. Chem. Res., vol. 35, No. 8, pp. 2539-2545, Aug. 1996.

Gallagher-Wetmore, P. et al., "Supercritical Fluid Processing: A New Dry Technique for Photoresist Developing," SPIE vol. 2438, pp. 694-708, Jun. 1995.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac. Sci. Technol. A. vol. 11, No. 4, Jul. 1993, pp. 1696-1701.

Hansen, B.N. et al., "Supercritical Fluid Transport—Chemical Deposition of Films,"Chem. Mater., vol. 4, No. 4, pp. 749-752, 1992.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

Joseph L. Foszcz, "Diaphragm Pumps Eliminate Seal Problems", Plant Engineering, pp. 1-5, Feb. 1, 1996.

Bob Agnew, "WILDEN Air-Operated Diaphragm Pumps", Process & Industrial Training Technologies, Inc., 1996.

* cited by examiner

PRESSURE ENERGIZED PRESSURE VESSEL OPENING AND CLOSING DEVICE AND METHOD OF PROVIDING THEREFOR

RELATED APPLICATION

This patent application claims priority under 35 U.S.C. 119 (e) of the co-pending U.S. Provisional patent application Ser. No. 60/357,763 filed Feb. 15, 2002, and entitled "PRESSURE ENERGIZED PRESSURE VESSEL CLOSURE". The Provisional patent application Ser. No. 60/357,763 filed Feb. 15, 2002, and entitled "PRESSURE ENERGIZED PRESSURE VESSEL CLOSURE" is also hereby incorporated by reference.

FIELD OF THE INVENTION

The invention relates to a method and apparatus for processing a semiconductor wafer under supercritical conditions in general, and specifically, to a method and apparatus for sealing a pressure vessel by taking advantage of leverage and the internal pressure of the vessel itself.

BACKGROUND OF THE INVENTION

Pressure vessels that are used in processing semiconductor wafers require constant access to the interior of the vessel or chamber. This constant access to the chamber poses quite a challenge in opening and closing technology. In processing a semiconductor wafer, the chamber of the vessel must be accessed for inputting the wafer and then accessed again for removing the wafer. This process may be repeated every few minutes, possibly 24 hours a day, 7 days a week. Therefore, speed as well as normal wear and tear become key concerns in the process.

Many technologies exist for opening and closing the door to the vessel. However, many of these technologies have drawbacks, because they attempt to use brute external force to hold the door mechanism and the vessel together. For instance, the typical multibolted flange configured to seal the chamber of the vessel is not practical from a time standpoint, because the repeated opening and closing of the flange overall takes a significant amount of time. In addition, the multibolted flange is impractical from a wear and tear perspective, because the repeated opening and closing of the flange wears down the bolts and nuts over time. Further, multibolted flanges utilize an external force to secure the flange to the vessel to the seal the vessel. This requires additional equipment and powering means to accomplish the overall task of processing the wafer. Other technologies to open and close the pressurized vessel and provide a seal to the chamber are known in the art and are not discussed here further.

What is needed is a method and apparatus for sealing a pressure vessel, whereby the apparatus takes advantage of the internal pressure of the vessel itself as a means to secure and seal the vessel.

SUMMARY OF THE INVENTION

In one aspect of the invention, a closure assembly is coupled to a vessel which includes a chamber and an access port for receiving a wafer. The access port is in communication with the chamber. The closure assembly comprises a door assembly that is coupled to the vessel and is configured to move between an open position and a closed position. The door assembly is in contact with the access port at a first location, thereby sealing the chamber in the closed position. Pressure within the chamber applies a force to the door assembly at the first location. The closure assembly includes an actuator that is in moveable contact with the door assembly at a second location. The actuator is configured to apply a counteracting force to the door assembly at the second location in response to pressure within the chamber, thereby maintaining the door assembly in the closed position. The door assembly is configured to rotate about a fulcrum point when it is in the closed position, whereby the counteracting force is preferably substantially equivalent to the pressure forces applied to the door assembly. The actuator is configured within an actuator bore, whereby the actuator bore is configured within the vessel and is coupled with the chamber. The actuator is configured to move between a non-actuated position and an actuated position within the actuator bore. The actuator is in the actuated position when a desired amount of pressure is applied to the actuator bore. The actuator is configured to allow the door assembly to move from the closed position to the open position in response to a desired amount of pressure that is released from the chamber. The vessel further comprises a pressure conduit that is coupled to the actuator, wherein the pressure conduit channels the pressure to the chamber and the actuator. The closure assembly further includes a regulator valve that is positioned within the pressure port. The regulator valve collects the desired amount of pressure within the pressure conduit to actuate the actuator before allowing the pressure to enter the chamber. The door assembly further comprises a door member that covers the access port in the first location and an extendable member that is coupled to the door member. The extendable member drives the door member between the open and closed positions. The door assembly further comprises a sealing element that is coupled to the door member and is configured to provide a seal between the door member and the access port. The door assembly further comprises a lever element that is coupled to the vessel, whereby the lever element is rotatable about a fulcrum point between the open position and the closed position. The closure assembly further comprises an arm member that locks the door member into the closed position. The closure assembly alternatively comprises a guiding element that has a first feature that faces the outer surface of the vessel, whereby the guiding element is coupled to the vessel. The door member alternatively includes a second feature that is configured to correspond with the first feature of the guiding element. The first feature and the second feature alternatively form a fulcrum point when they are mated in communication with one another and the door member is covering the access port.

In another aspect of the invention, a pressure energized closure device is coupled to a vessel having a chamber that is configured to be pressurized within. The vessel has an access port which receives a wafer. The access port is configured on an outer surface of the vessel and is in communication with the chamber, whereby the closure device comprises a door assembly that is configured to move between a first position and a second position. The door assembly is configurable to form an airtight condition within the chamber in the second position. A pressure conduit is within the vessel and is coupled to the chamber, whereby the pressure conduit is configured to pressurize the chamber. The device includes an actuator that is in moveable contact with the door assembly and is coupled to the pressure conduit. The actuator is configured to maintain the door assembly in the second position in response to pressure within the pressure conduit. The actuator is configured to allow the door member to move from the second position to the first position in response to a desired amount of pressure that is released from the pressure conduit. The vessel further comprises a pressure port that is coupled to the pressure conduit, wherein the pressure port provides pressure to the pressure conduit. The pressure energized closure device further comprises a regulator valve that is positioned within the pressure port. The regulator valve collects the desired amount of pressure within the pressure conduit to actuate the actuator before allowing the pressure to enter the chamber. The door assembly further comprises a door member which covers the access port and an extendable member that is coupled to the door member, wherein the extendable member drives the door member between the open and closed positions. The door assembly further comprises a sealing element that is coupled to the door member. The sealing element is positionable between the door member and the outer surface of the vessel. The pressure energized closure device further comprises a lever element that is coupled to the vessel. The lever element is rotatable about a fulcrum point between the first position and the second position. The pressure energized closure device further comprises an arm member for locking the door member in the closed position. The pressure energized closure device alternatively comprises a guiding element that is coupled to the vessel. The guiding element has a first feature that faces the outer surface of the vessel. The door member alternatively includes a second feature that is configured to correspond with the first feature of the guiding element. The first feature and the second feature form a fulcrum point about which the door assembly rotates when mated in communication with one another when the door member is covering the access port.

In yet another aspect of the invention, a closure assembly is coupled to a chamber configured to be pressurized. The closure assembly comprises means for sealing the pressurized chamber. The means for sealing is configured to move between a first position and a second position. The pressurized chamber is sealed when the means for sealing is in the second position. In addition, the closure assembly further includes means for maintaining the means for sealing in the second position in response to the pressure generated within the pressurized chamber.

In yet another aspect of the present invention, a method of sealing a pressurized chamber comprises providing a chamber that has a pressure port and is configured to be pressurized within. The method further comprises coupling a door assembly to the chamber, whereby the door assembly is configured to move between a first position and a second position, wherein the chamber is sealed when the door assembly is in the second position. The method further comprises coupling an actuator to the pressure port, whereby the actuator is configured to be in moveable contact with the door assembly such that the pressurized chamber causes the actuator to force the door assembly in the second position.

Other features and advantages of the present invention will become apparent after reviewing the detailed description of the preferred embodiments set forth below.

DETAILED DESCRIPTION OF THE PRESENT INVENTION

Figure 1:
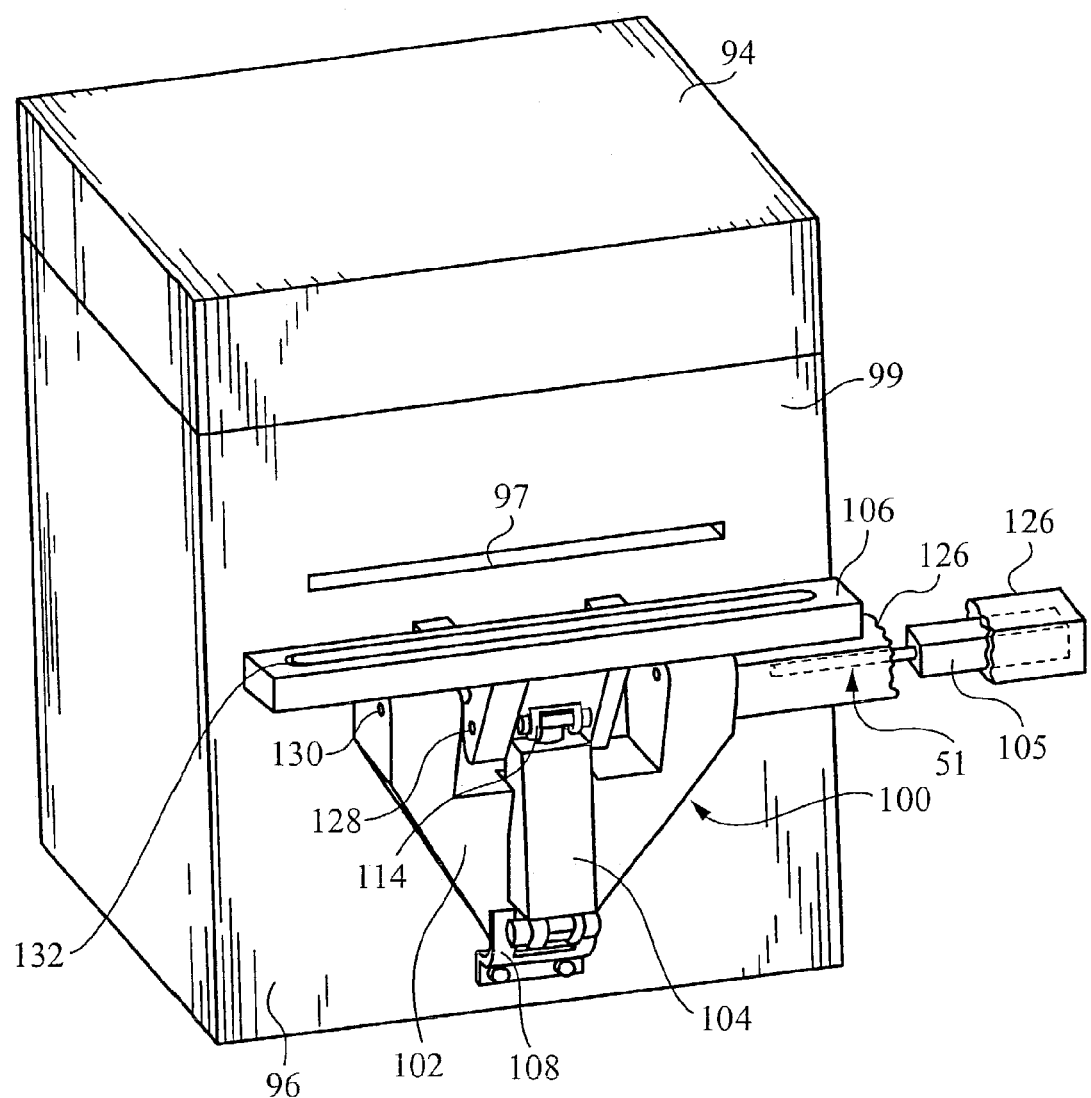
FIG. 1 illustrates a perspective view of a vessel having the door assembly in an open position in accordance with the preferred embodiment of the present invention.

FIG. 1 illustrates a perspective view of a vessel having a door assembly in an open position in accordance with the preferred embodiment of the present invention. As shown in FIG. 1, the door assembly 100 is coupled to the vessel 99 and is in an open position. The vessel 99 includes an inner chamber 98 (FIGS. 2 and 3) and an slot 97 for receiving the semiconductor wafer, whereby the slot 97 leads to the iuner chamber 98 (FIGS. 2 and 3) and is in communication with the chamber 98. The slot 97 has dimensions large enough to allow insertion and removal of the semiconductor wafer. However, the slot 97 has small enough dimensions, such that minimum required forces are needed to seal the slot 97 and chamber 98. In addition, the vessel includes a chamber top 94 which closes the vessel 99 and seals the chamber 98 from above. The vessel 99 is configured to be pressurized to a predetermined amount of pressure when processing a semiconductor wafer. Preferably, the vessel 99 is used to house the wafer that undergoes processing under supercritical conditions. Alternatively, the vessel is used to house the wafer that undergoes processing under non-supercritical conditions. The door assembly 100 in the preferred embodiment includes a lever mechanism 102 coupled to the vessel 99, an extendable member 104 coupled to the lever mechanism 102, and a door 106 coupled to the extendable member 104 and the lever mechanism 102. In addition, a spring clip 108 is attached to the outer surface of the vessel 99 and is configured to retain tension between the door assembly 100 and the piston 118 when the door assembly 100 is in the closed position (FIG. 3), as discussed below. Further, as shown in FIG. 1, an arm member 126 is preferably coupled to the lever mechanism 102. The arm member 126 includes an actuating cylinder 105 within, whereby the actuating cylinder 105 actuates a support pin 51 between a retracted and extended position. The support pin 51, when in the extended position, locks the door 106 in position when the door assembly 100 is in the closed position (FIG. 3), by fitting the pin 51 through the corresponding apertures 130 in the lever mechanism 102.

Figure 2:
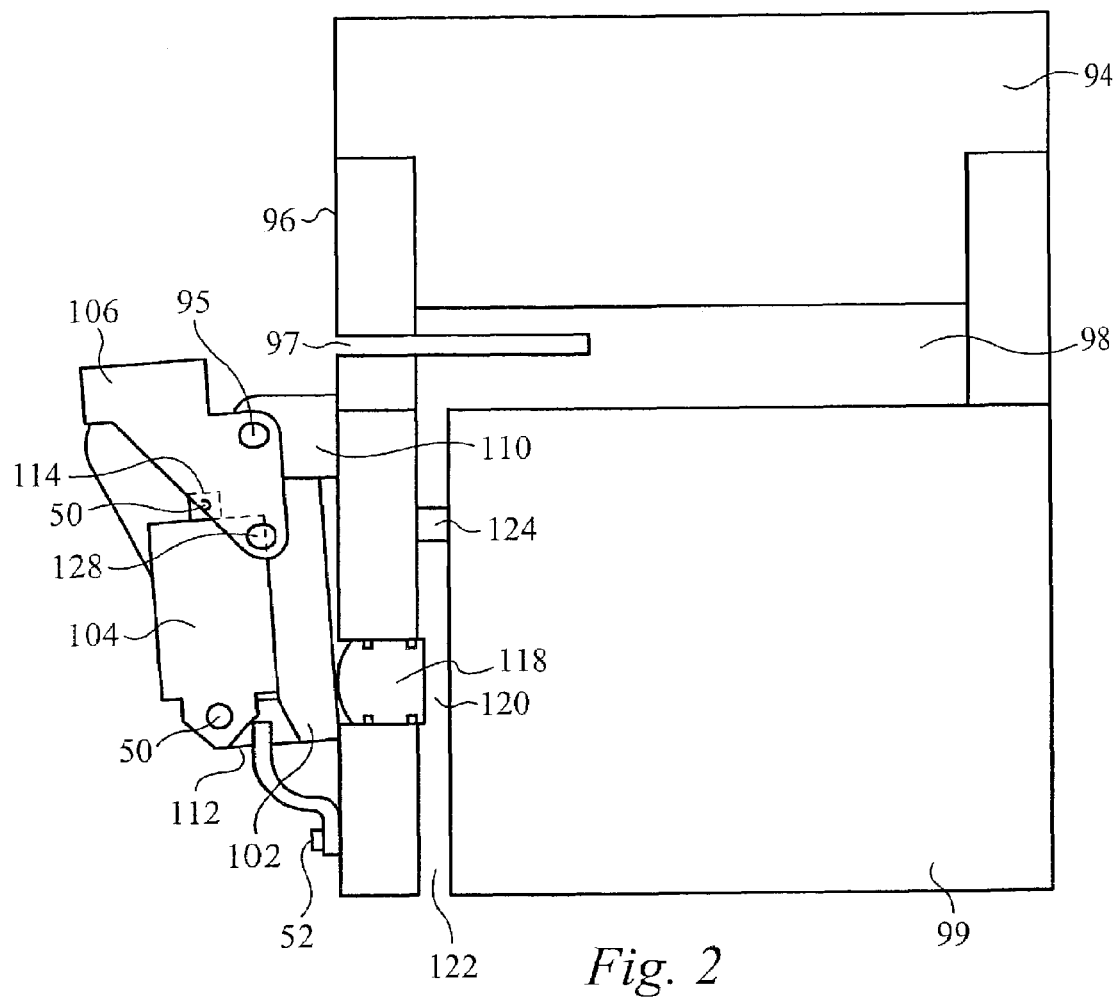
FIG. 2 illustrates a cross sectional schematic of the vessel with door assembly in the open position in accordance with the preferred embodiment of the present invention.
Figure 3:
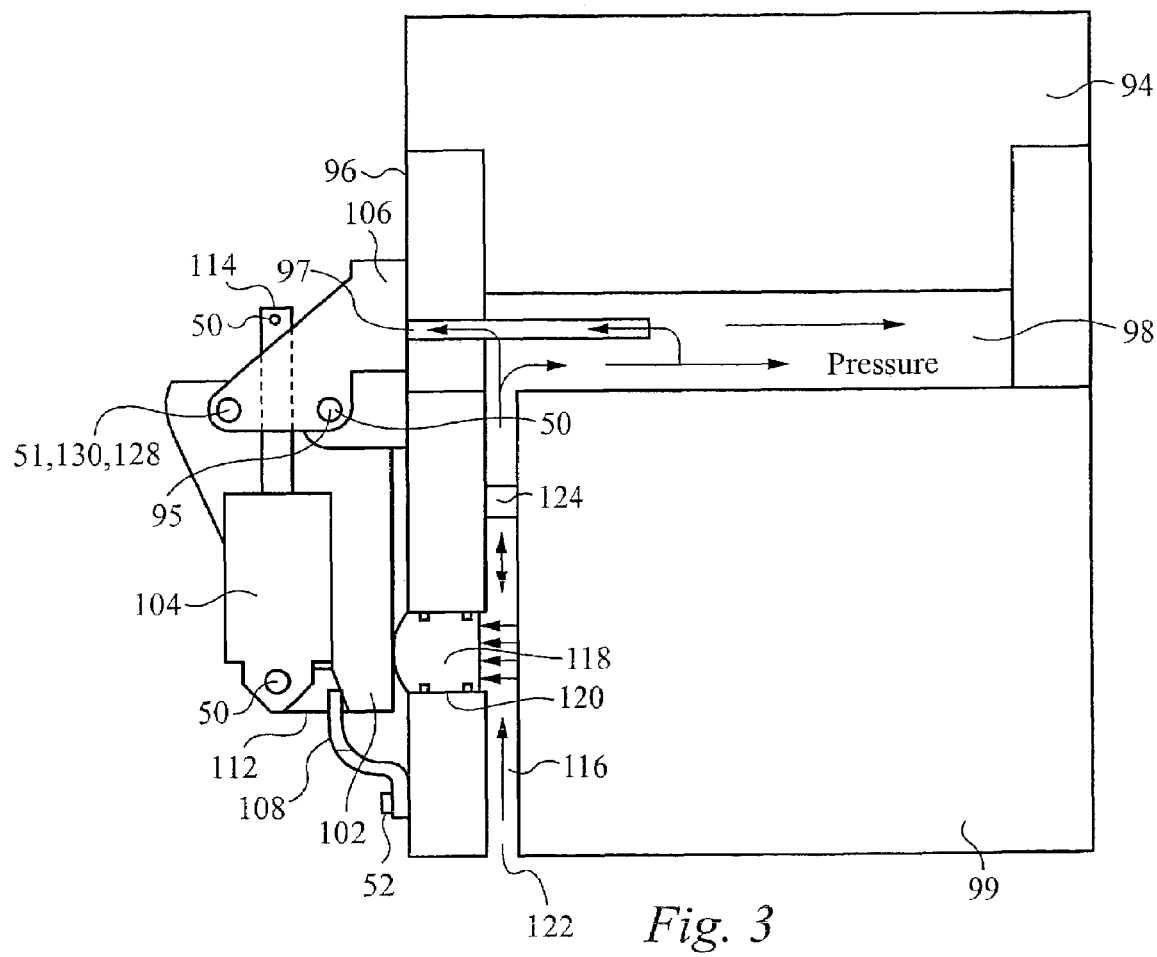
FIG. 3 illustrates a cross sectional schematic of the vessel with door assembly in the closed position in accordance with the preferred embodiment of the present invention.

FIG. 2 illustrates a cross sectional schematic of the vessel with the door assembly in the open position in accordance with the preferred embodiment of the present invention. FIG. 3 illustrates a cross sectional schematic of the vessel with the door assembly in the closed position in accordance with the preferred embodiment of the present invention. As shown in FIG. 2, the vessel 99 includes a member 110 extending out from the outer surface 96 which serves as a fulcrum point 95 about which the door assembly 100 rotates, as discussed below. The lever mechanism 102 is coupled to the member 110 preferably with a pin 50, whereby the lever mechanism 102 rotates about the member 110. As shown in FIG. 2, the extendable member 104 is coupled to the lever member 112 of the lever mechanism 102 with a pin 50. The extendable member 104 is also coupled to the door 106 about a receiving member 114, in which a pin 50 secures the cylinder 104 to be in rotatable engagement with the door 106. In addition, as shown in FIG. 2, the spring clip 108 is coupled to the outer surface 96 of the vessel 99 by a pair of bolts 52, whereby the spring clip 108 is configured to come into contact with the lever mechanism 102 near the lever member 112 and retain the door assembly 100 against the piston 118 in the closed position. Further, as shown in FIG. 2, the present invention includes a pressure actuated piston 118 positioned within the pressure bore 120 in the vessel 99, whereby the piston 118 is preferably in contact with the lever mechanism 102 of the door assembly 100 in the closed position. In addition, the piston 118 is preferably in contact with the door assembly 100 in the open position although it is not necessary.

In the preferred embodiment, the door 106 is configured to rotate between a horizontal, open position (FIG. 2) and a vertical, closed position (FIG. 3). In the open position, the slot 97 of the vessel 99 is accessible, whereby a wafer (not shown) is placed within the chamber 98 of the vessel 99 through the slot 97. As stated above, the extendable member 104 is coupled to the door 106. The cylinder 104 extends from the retracted position (FIG. 2) to the extended position (FIG. 3) and thereby rotates the door 106 clockwise about the fulcrum point 95 from the open position (FIG. 2) to the closed position (FIG. 3). Once in the closed position, the door 106 covers the slot 97 and the securing aperture 128 is positioned in communication with the corresponding aperture 130 of the lever mechanism 102. In the closed position, the actuating cylinder 105 within the arm member 126 (FIG. 1) slides the support pin 51 through the securing aperture 128 of the door member 106 and the corresponding aperture 130 (FIG. 1) of the lever mechanism 102. The pin 51 through the securing aperture 128 and the corresponding lever mechanism aperture 130 locks the door 106 in relation to the lever mechanism 102, thereby forming a one rotating unit door assembly 100 which entirely rotates about the fulcrum point 95. The door 106 presses against the outer surface 96 of the vessel 99 and thereby seals the chamber 98 to allow the chamber 98 to be pressurized. It is preferred that the door 106 include an O-ring 132 (FIG. 1) that is coupled thereto, whereby the O-ring 132 provides a sufficient seal between the chamber 98 and the door 106. Alternatively, the O-ring is coupled to the outer wall 96 of the vessel 99 (not shown) and provides a seal between the chamber 98 and door 106 once the door 106 covers the slot 97.

The extendable member 104 is preferably an air cylinder; however any other type of device including, but not limited to a hydraulic cylinder, solenoid, pneumatic cylinder or ball screw, is contemplated. Preferably the extendable member 104 is powered to retract and extend by an external source (not shown). Alternatively, the extendable member 104 is powered to retract and extend by utilizing the pressure supplied from a pressure port 122. Alternatively, a check valve 124 builds up the adequate amount of pressure from the pressure conduit 116 to operate the extendable member 104, as will be discussed below.

The vessel 99, as shown in FIG. 2, preferably includes a pressure conduit 116 configured within, whereby the pressure conduit 116 is in communication with the chamber 97. In addition, the vessel 99 includes a pressure port 122 preferably in communication with the pressure conduit 116 and the chamber 97. Thus, the chamber 97 is pressurized by pressure supplied through the pressure conduit 116 from the pressure port 122. The pressure conduit 116 is also preferably in communication with the piston bore 120 and piston 118, whereby an adequate amount of pressure within the pressure conduit 116 fills the piston bore 120 and energizes the piston 118 to actuate the piston 118 from the inward, non-energized position (FIG. 2) to the outward, energized position (FIG. 3). In particular, the piston 118 is preferably in the inward position within the piston bore 120 when the door assembly 100 is in the open position, as shown in FIGS. 1 and 2. However, the piston 118 preferably actuates outward in the piston bore 120 toward the door assembly 100 when a sufficient amount of pressure in the pressure conduit 116 actuates the piston 118.

The piston 118 is configured to be in contact with the door assembly 100 in the closed position. Alternatively, the piston 118 is not in contact with the door assembly 100 in the open position (FIG. 2). The internal pressure within the vessel 99 moves the piston 118 from the inward position (FIG. 2) to the outward position (FIG. 3) in the piston bore 120, whereby the piston 118 applies a force to the door assembly 100 at the point where the piston 118 is configured to come into contact with the door assembly 100. As stated above, the chamber 98 is pressurized when the wafer is being processed and the chamber 98 is sealed by the door 106 covering the slot 97. Since the slot 97 leads into the chamber 99, the pressure within the pressurized chamber applies pressure forces to the door 106 and the door assembly 100. As stated above, the chamber 98 is preferably pressurized under supercritical conditions. Alternatively, the chamber 98 is pressurized under non-supercritical conditions. In particular, as shown in FIG. 3, the pressure forces applied to the door 106 through the slot 97 cause the door assembly 100 to rotate counterclockwise about the fulcrum point 95, thereby tending to disrupt the seal provided by the door assembly 100. To counteract these forces applied to the door 106, the piston 118 applies a countering force to the door assembly 100 at a predetermined position along the lever mechanism 102 and door assembly 100 as shown by the arrows in FIG. 3. The countering force applied by the piston 118 causes the door assembly 100 to rotate clockwise about the fulcrum point 95 and secures the door assembly 100 against the outer surface 96 of the wafer 98 in the closed position, thereby keeping the chamber 98 sealed. Preferably, the piston 118 applies a force on the one rotating unit door assembly 100 which is substantially equivalent to the pressure in the piston bore 120. Alternatively, the force applied by the piston 118 is larger than the pressure within the chamber 98. In addition, the spring clip 108 retains the door assembly 100 and presses the door assembly 100 against the piston 118 such that the force from the piston 118 keeps the door assembly 100 in the closed position. In effect, the door assembly 100 securely seals the chamber 98 without using any additional external forces.

The predetermined position along the door assembly 100 depends on a variety of factors, such as the amount of pressure in the pressure conduit 116 and piston bore 120 and size of the piston 118 itself. The amount of force applied by the piston 118 to the door assembly 100 depends on several variables including, but not limited to, the size of the piston 118, the distance between the fulcrum point 95 and where the piston 118 touches the door assembly 100 as well as the amount of pressure applied to the piston 118 in the piston bore 120.

The operation of the present invention will now be discussed. The operation of the preferred embodiment of the present invention includes inserting a wafer to be processed through the slot 97 of the chamber 98. Once the wafer is placed within the chamber 98, the extendable member 104 extends upwards, thereby rotating the door 106 clockwise from the horizontal, open position, as shown in FIG. 2, to the vertical, closed position, as shown in FIG. 3. As stated above, the cylinder 104 is preferably powered by external means. Alternatively, the cylinder 104 extends upwards by applying pressure from the pressure port 122, regulated or unregulated, directly to the cylinder 104. The door 106, once rotated to the closed position, comes into contact with the outer surface 96 of the vessel 99 and covers the slot 97. The actuating cylinder 105 then slides the support pin 51 through the securing aperture 128 in the door 106 and the corresponding locking mechanism aperture 130. The support pin 51 locks the door 160 in the vertical, closed position and effectively causes the door 106, lever mechanism 102 and cylinder 104 to become one rotating unit which then entirely rotates about the fulcrum point 95.

At this point, the chamber 98 is closed, because the door 106 covers the slot 97. The chamber 98 is pressurized by applying pressure though the pressure port 122. The pressure is introduced into the vessel 99 through the pressure port 122 and the pressure conduit 116. The pressure preferably fills up the chamber 98 to the predetermined processing pressure. Once the chamber 98 is pressurized, pressure forces are exerted at the door 106 through the slot 97 causing the door assembly 100 to move counterclockwise and disrupt the seal in the chamber 98. Meanwhile, the pressure within the chamber 98 flows through the pressure conduit 116, whereby the pressure fills the piston bore 120 and causes the piston 118 to move outward toward the lever mechanism 102. The outward movement of the piston 118 pressing against the door assembly 102 causes the entire door assembly 100 to rotate clockwise (FIG. 3) about the fulcrum point 95 and maintain the door 106 against the outer surface 96 of the vessel 99. Alternatively, a check valve 124 is configured within the pressure conduit 116 and placed between the chamber 98 and the piston 118 and piston bore 120. The check valve 124 allows sufficient pressure to build up between the pressure port 122 and the valve 124 before the pressure enters the chamber 98. This allows sufficient amount of pressure to actuate the piston 118 and secure the door assembly 100 in the closed position before the chamber 98 is pressurized and exerts opposing pressure forces on the door 106. In addition, the spring clip 108 retains the door assembly 100 and presses the door assembly 100 against the piston 118 such that the force from the piston 118 keeps the door assembly 100 in the closed position. In effect, the door assembly 100 securely seals the chamber 98 without using any additional external forces.

After the wafer has been processed and is ready to be removed, the pressure port 122 is opened to allow the pressure within the chamber 98 and conduit 116 to exit the vessel 99. Preferably, the pressure exits the chamber 98 out through an additional port in the chamber 98 (not shown). As the pressure exits the chamber 98, the pressure exerted on the door 106 through the slot 97 decreases. In addition, as the pressure is released from the vessel 99, the amount of pressure in the piston bore 120 decreases. This decrease in pressure in the piston bore 120 allows the door assembly 100 to move the piston 118 gradually inward back to the inward position. This movement of the piston 118 and the tension force from the spring clip 108 urges the door assembly 100 to rotate counterclockwise about the fulcrum point 95 back to the open position. Preferably, the pressure is gradually released from the vessel and the actuating cylinder 105 retracts the support pin 51 and unlocks the door 106 from the closed position, thereby allowing the door 106 to freely rotate about the fulcrum point 95. Once the door 106 is unlocked, the door assembly 100 is no longer one rotating unit and the extendable member 104 retracts to allow the door assembly 100 to rotate counter clockwise about the fulcrum 95 back to the open position and allowing access the slot 97.

Figure 4:
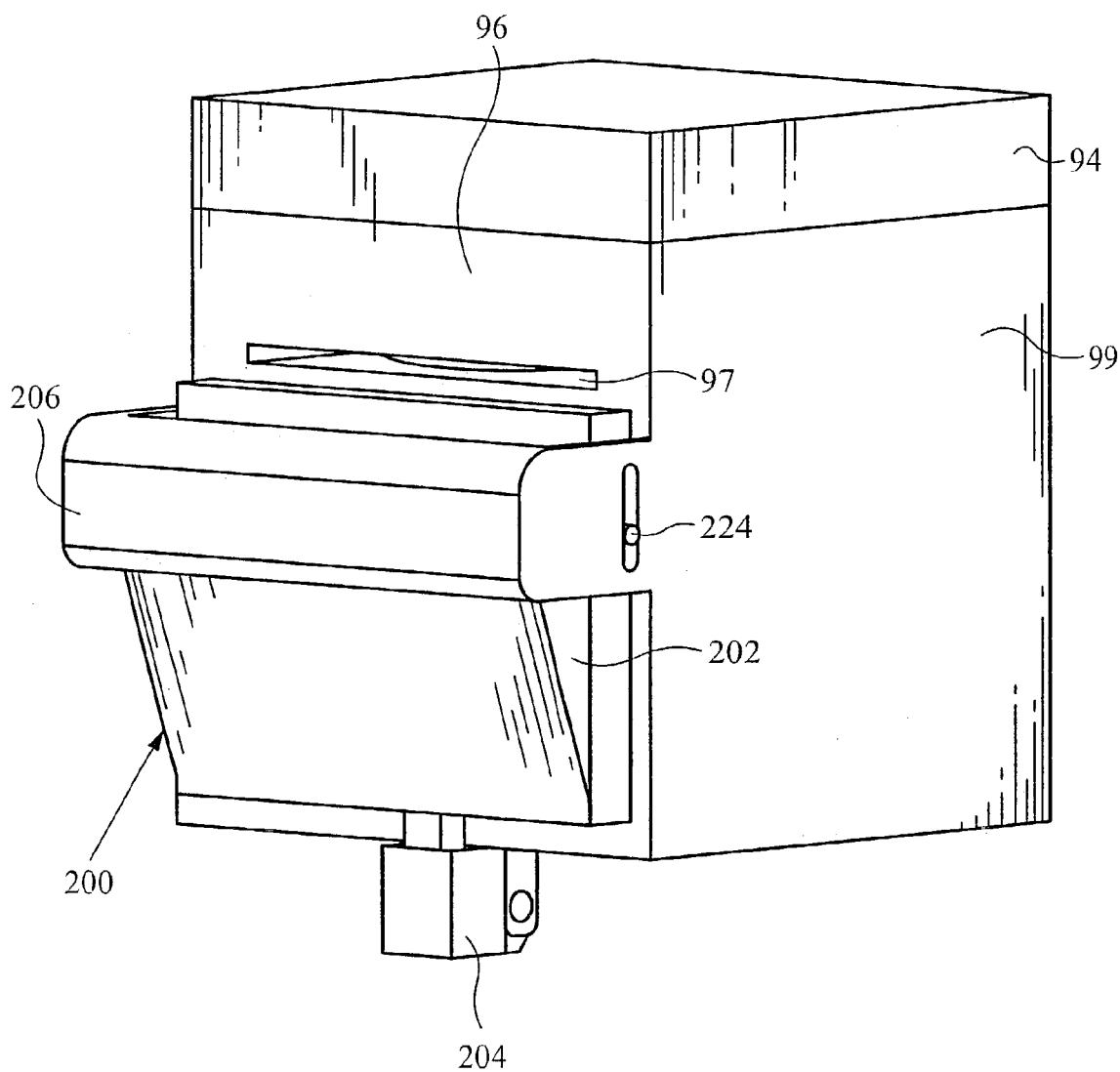
FIG. 4 illustrates a perspective view of an alternative embodiment of the vessel with the door assembly in accordance with the present invention.
Figure 5:
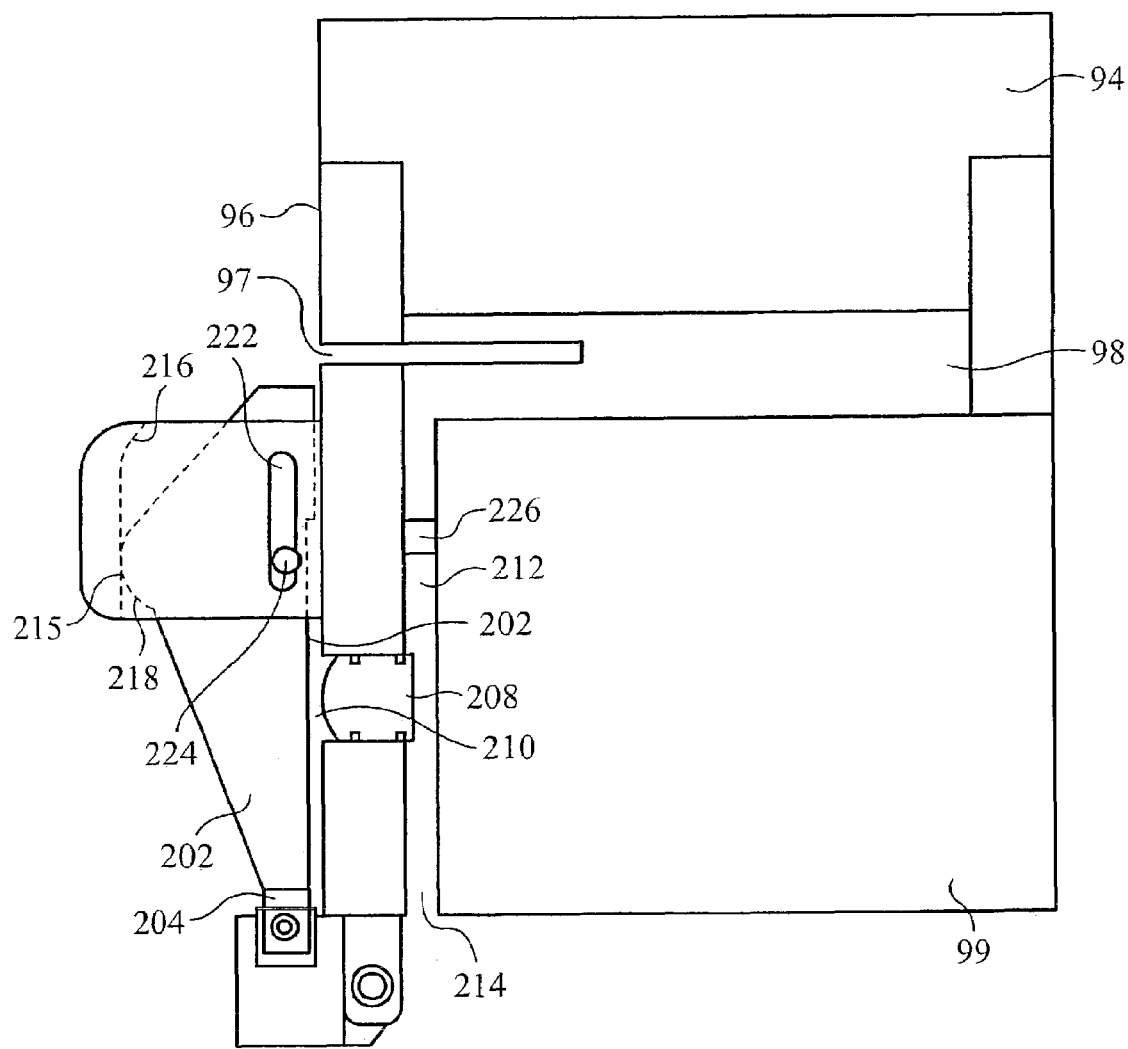
FIG. 5 illustrates a cross sectional schematic of the vessel having the door assembly in the open position in accordance with the alternative embodiment of the present invention.
Figure 6:
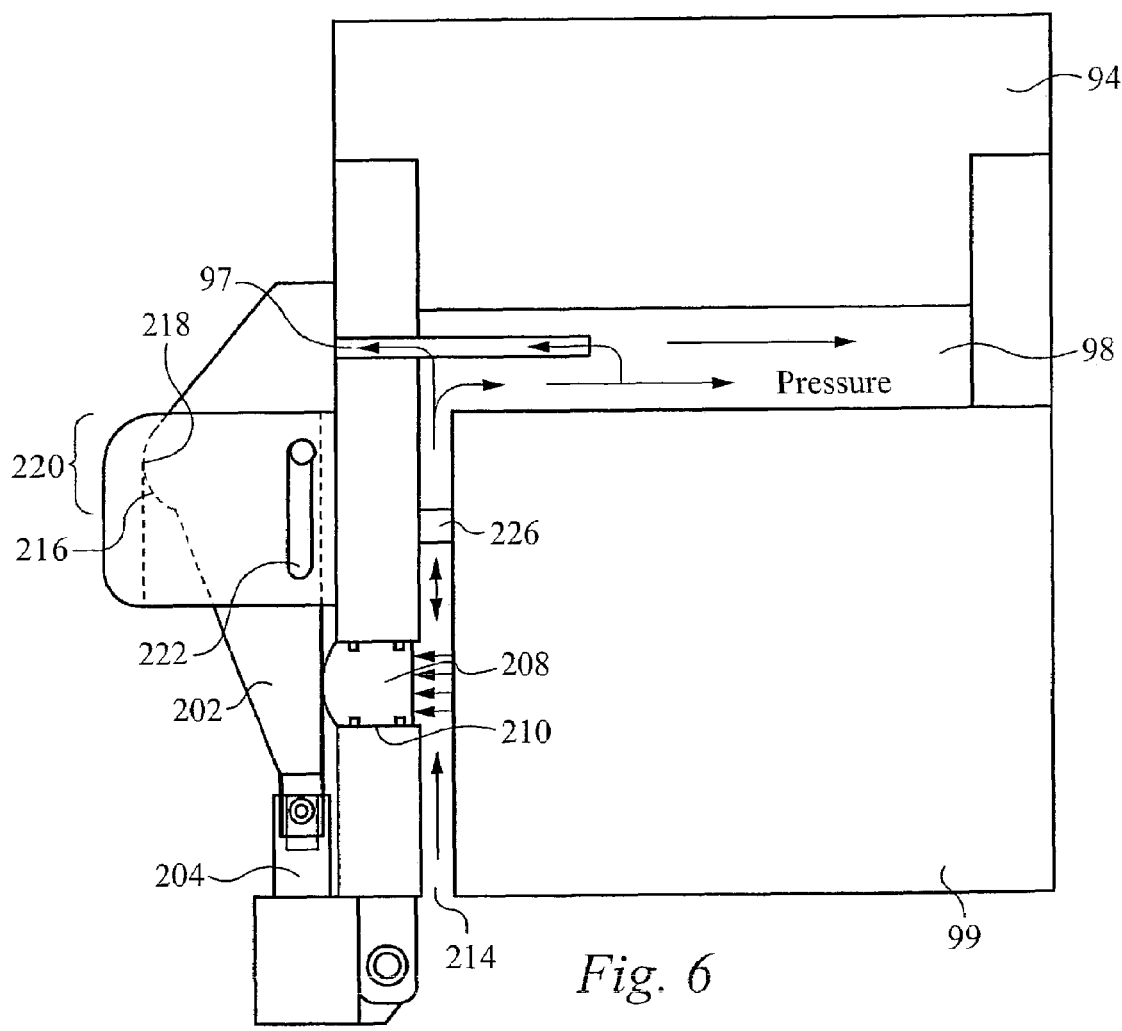
FIG. 6 illustrates a cross sectional schematic of the vessel having the door assembly in the closed position in accordance with the alternative embodiment of the present invention.

FIG. 4 illustrates an alternative embodiment of the vessel with door assembly in accordance with the present invention. As shown in FIG. 4, the door assembly 200 is coupled to the vessel 99 and is in an open position. The vessel 99 includes an inner chamber 98 (FIGS. 5 and 6) and a slot 97 for receiving the semiconductor wafer, whereby the slot 97 leads to the inner chamber 98 (FIGS. 5 and 6). In addition, the vessel includes a chamber top 94 which closes the vessel 99 and seals the chamber 98 from above. As shown in FIG. 4, the door assembly 200 includes a door 202, an extendable member 204 coupled to the door 202 and the vessel 99, and a guide member 206 coupled to the vessel 99 and the door 202.

FIG. 5 illustrates a cross sectional schematic of the vessel 99 having the door assembly 200 in the open position in accordance with the alternative embodiment of the present invention. As shown in FIG. 5, a piston 208 is configured within the piston bore 210 and is coupled to the pressure conduit 212 and pressure port 214. The piston 208 operates in regard to pressure filling the piston bore 220 in the same manner as discussed above in the preferred embodiment. The guide member 208 includes a guide slot 222, shown in FIGS. 4–6, on each side which vertically runs along the side walls of the guide member 208. In addition, guide pins 224 in the side of the door 202 to engage the guide slots 222 in the guide member 208 and keep the door 202 in position as the door 202 moves between the open and closed positions (FIG. 6).

As shown in FIG. 5, the guide member 206 extends outward from the outer surface 96 of the vessel 99 and has an inner contoured surface 216. In addition, as shown in FIG. 5, the door 202 has a backside, outer contoured surface 218 which is configured to match and engage with the inner contoured surface 216 of the guide member 206 when the door 202 is in the closed position (FIG. 6). Specifically, the backside surface of the door 202 includes a radiused feature which is configured to match the internal radiused feature in the inner surface 216 of the guide member 208 to form the fulcrum point 216.

FIG. 6 illustrates a cross sectional schematic of the vessel 99 having the door assembly 200 in the closed position in accordance with the alternative embodiment of the present invention. As shown in FIG. 6, the outer surface 218 of the door 202 has a radius contour and slides along the vertical section 215 of the guide member's 208 inner surface when moving between the open and closed positions. The guide pins 224 are engaged within the guide slot 222 and ensure that the door 202 appropriately moves vertically up the outer surface 96 of the vessel 99. Once the radius portion of the outer surface 218 reaches the radius portion of the inner surface 216, the two surfaces mate with each other and form the fulcrum point 220 therebetween. At the point where the two surfaces mate, the door 202 is positioned to cover the slot 97 and thereby seal the chamber 98. It is about the fulcrum point 220 that the door assembly 200 rotates when the pressure from the chamber 98 is exerted through the slot 97 upon the door 202. Similarly, it is about the fulcrum point 220 which the door assembly 200 rotates when the piston 208 applies the counteracting force to the door assembly 200. The guide member 206 as well as the extendable member 204 retain the door assembly 200 and presses the door assembly 200 against the piston 208 such that the force from the piston 208 keeps the door assembly 200 in the closed position. In effect, the door assembly 200 securely seals the chamber 98 without using any additional external forces. It should be noted that the inner surface 216 and the outer contoured surface 218 alternatively has any other shape as long as both surfaces together form one or more fulcrum points about which the door assembly 200 rotates.

The operation of the alternative embodiment of the present invention will now be discussed. The operation of the alternative embodiment of the present invention includes inserting a wafer to be processed into the chamber 98 through the slot 97. Once the wafer is placed within the chamber 98, the extendable member 204 extends upwards, thereby moving the door 202 vertically from the open position, as shown ill FIG. 5, to the closed position, as shown in FIG. 6. As stated above, the extendable member 204 extends upwards by externally powering the cylinder 204. Alternatively, the extendable member 204 extends upwards by applying regulated or unregulated pressure from the pressure port 214 directly to the cylinder 204. As stated above and shown in the figures, the outer surface 218 of the door 202 has a radius contour and slides along the vertical section 215 of the guide member's 208 inner surface. Thus, the guide pins 224 engaged within the slot 222 guide the door 202 vertically upward along the inner vertical surface 215 of the guide member 206. Once the radius portion of the outer surface 218 reaches the radius portion 216 of the inner surface 216, the outer surface 218 engages the receiving portion 216 of the inner surface and the two surfaces mate with each other and form the fulcrum point 220, as shown in FIG. 6.

Once the inner surface 216 and the outer surface 218 are engaged, the chamber 98 is sealed and the door 202 covers the slot 97. The chamber 98 is configured to be pressurized by applying pressure though the pressure port 122, whereby pressure fills up the chamber 98 to the predetermined processing pressure. As stated above the pressure is under supercritical conditions. Alternatively, the pressure is under non-supercritical conditions. Once the chamber 98 is pressurized, pressure forces are exerted on the door through the slot 97 and cause the door 202 to move counterclockwise about the fulcrum point 220 (FIG. 6). Meanwhile, the pressure within the chamber 98 flows through the pressure conduit 212, whereby the pressure fills the piston bore 210 and causes the piston 208 to move outward toward the door 202. The outward movement of the piston 208 pressing against the door assembly 200 causes the entire door assembly 200 to rotate clockwise (FIGS. 5 and 6) about the fulcrum point 220 and counteract the forces applied through the slot 97. It is preferred that the counteracting force is substantially equivalent to the pressure forces applied through the slot 97. Alternatively, the counteracting force is substantially larger than the pressure forces applied through the slot 97. The counteracting force from the piston secures the door 202 against the outer surface 96 of the vessel 99 and maintains the seal in the chamber 98. Alternatively, a check valve 226 is configured within the pressure conduit 212 and placed between the chamber 98 and the piston 208 and piston bore 210. The check valve 226 allows sufficient pressure to build up between the pressure port 214 and the valve 226 before the pressure enters the chamber 98. This allows a sufficient amount of pressure to actuate the piston 208 and secure the door assembly 200 in the closed position before the chamber 98 is pressurized and exerts pressure forces through the slot 97 on the door 202. The guide member 206 as well as the extendable member 204 retain the door assembly 200 and presses the door assembly 200 against the piston 208 such that the force from the piston 208 keeps the door assembly 200 in the closed position. In effect, the door assembly 200 securely seals the chamber 98 without using any additional external forces.

After the wafer has been processed and is ready to be removed, a pressure port (not shown) is opened to allow the pressure within the chamber 98 and conduit 212 to exit the vessel 99. In addition, as pressure is released from the vessel 99, the amount of pressure in the piston bore 210 decreases and causes the piston 208 to gradually move back to the retracted position in the bore 210. This movement of the piston 208 and the restraining force from the guide member 206 and cylinder 206 urges the door assembly 200 to rotate counterclockwise about the fulcrum point 220 back to the open position. The counterclockwise rotation of the door assembly 200 and the slight offset between the inner surface 216 and the outer surface 218 causes makes the door 200 move partially rearward such that the radius features of the inner surface 216 and outer surface 218 disengage each other. In addition, the angle and position of slot 222 is configured such that pins 224 are predisposed to rotate the door 202 slightly rearward, thereby creating a gap between the sealing face of the door 202 and the chamber 99. The retraction of the extendable member 204 aids in disengagement and causes the door 202 to be drawn vertically downward back to the open position (FIG. 5).

Individual designs of the door assembly discussed herein are for exemplary purposes. It should be noted that other designs of the door assembly and other components for sealing the door to the vessel and moving the door between the open and closed positions are contemplated within the present invention. It should be noted that any variations of the door assembly is contemplated within the present invention so long as the design includes an actuator utilizing the pressure within the vessel to secure the door and door assembly to the vessel and seal the chamber about one or more fulcrum points. The plumbing of port 122 (FIG. 2), 214 (FIG. 5) to the piston 118 (FIG. 2), 208 (FIG. 5), chamber 98 and regulator device 124 (FIG. 2), 226 (FIG. 5) is preferably accomplished individually and externally to the pressure vessel 99. Alternatively, the plumbing of the port is accomplished internally. It should be noted that although fluid may be commonly shared between the piston 118 and the chamber area 98, commonality of fluid is not required. Also, the present invention has been described in terms of specific embodiments incorporating details to facilitate the understanding of the principles of construction and operation of the present invention. Such reference herein to specific embodiments and details thereof is not intended to limit the scope of the claims appended hereto. It will be apparent to those skilled in the art that modification s may be made in the embodiment chosen for illustration without departing from the spirit and scope of the invention.

What is claimed is:

1. A closure assembly coupled to a vessel including a chamber and an access port for receiving a wafer, the access port in communication with the chamber, the closure assembly comprising:
 a. a door assembly coupled to the vessel and configured to move between an open position and a closed position, wherein the door assembly further comprises a lever element coupled to the vessel, the lever element rotatable about a fulcrum point between the open position and the closed position, the door assembly in contact with the access port at a first location, thereby sealing the chamber in the closed position, wherein pressure within the chamber applies a force to the door assembly at the first location; and b. an actuator in moveable contact with the door assembly at a second location, the actuator configured to apply a counteracting force to the door assembly at the second location in response to pressure within the chamber and thereby maintaining the door assembly in the closed position.

2. The closure assembly according to claim 1 wherein the door assembly is configured to rotate about a fulcrum point when in the closed position, the counteracting force is substantially equivalent to the force applied to the door assembly.

3. The closure assembly according to claim 1 wherein the actuator is configured to allow the door assembly to move from the closed position to the open position in response to a desired amount of pressure released from the chamber.

4. The closure assembly according to claim 3 wherein the vessel further comprises a pressure conduit coupled to the actuator, wherein the pressure conduit channels the pressure to the chamber and the actuator.

5. The closure assembly according to claim 4 further comprising a regulator valve positioned within the pressure conduit, wherein the regulator valve collects the desired amount of pressure within the pressure conduit to actuate the actuator before allowing the pressure to enter the chamber.

6. The closure assembly according to claim 1 wherein the door assembly further comprises:

a. a door member for covering the access port in the first location; and b. an extendable member coupled to the door member, wherein the extendable member drives the door member between the open and closed positions.

7. The closure assembly according to claim 6 wherein the door assembly further comprises a sealing element coupled to the door member and configured to provide a seal between the door member and the access port.

8. The closure assembly according to claim 6 further comprising an arm member for locking the door member into the closed position.

9. The closure assembly according to claim 6 further comprising a guiding element having a first feature facing the outer surface of the vessel, the guiding element coupled to the vessel.

10. The closure assembly according to claim 9 wherein the door member includes a second feature configured to correspond with the first feature of the guiding element, wherein the first feature and the second feature form a fulcrum point when mated in communication with one another and the door member is covering the access port.

11. A pressure energized closure device coupled to a vessel having a chamber configured to be pressurized within, the vessel having an access port to receive a wafer, the access port configured on an outer surface of the vessel and in communication with the chamber, the closure device comprising:

a. a door assembly configured to move between a first position and a second position, the door assembly configurable to form an airtight condition within the chamber in the second position;

b. a pressure conduit within the vessel and coupled to the chamber, the pressure conduit configured to pressurize the chamber;

c. an actuator in moveable contact with the door assembly and coupled to the pressure conduit, the actuator configured to maintain the door assembly in the second position in response to pressure within the pressure conduit; and, d. a lever element coupled to the vessel, the lever element rotatably about a fulcrum point between the first position and the second position.

12. The pressure energized closure device according to claim 11 wherein the actuator is configured to allow the door member to move from the second position to the first position in response to a desired amount of pressure being released from the pressure conduit.

13. The pressure energized closure device according to claim 12 wherein the vessel further comprises a pressure port coupled to the pressure conduit, wherein the pressure port provides pressure to the pressure conduit.

14. The pressure energized closure device according to claim 13 further comprising a regulator valve positioned within the pressure conduit, wherein the regulator valve collects the desired amount of pressure within the pressure conduit to actuate the actuator before allowing the pressure to enter the chamber.

15. The pressure energized closure device according to claim 11 wherein the door assembly further comprises:

a. a door member for covering the access port; and b. an extendable member coupled to the door member, wherein the extendable member drives the door member between the open and closed positions.

16. The pressure energized closure device according to claim 15 wherein the door assembly further comprises a sealing element coupled to the door member, the sealing element positionable between the door member and the outer surface of the vessel.

17. The pressure energized closure device according to claim 15 further comprising an arm member for locking the door member in the closed position.

18. The pressure energized closure device according to claim 15 further comprising a guiding element coupled to the vessel, the guiding element having a first feature facing the outer surface of the vessel.

19. The pressure energized closure device according to claim 18 wherein the door member includes a second feature configured correspond with the first feature of the guiding element, wherein the first feature and the second feature form a fulcrum point when mated in communication with one another and the door member is covering the access port.

20. A closure assembly coupled to a vessel including a chamber and an access port for receiving a wafer, the access port in communication with the chamber, the closure assembly comprising:

a. a door assembly coupled to the vessel and configured to move between an open position and a closed position, the door assembly in contact with the access port at a first location, thereby sealing the chamber in the closed position, wherein pressure within the chamber applies a force to the door assembly at the first location; and b. an actuator in moveable contact with the door assembly at a second location, the actuator configured to apply a counteracting force to the door assembly at the second location in response to pressure within the chamber and thereby maintaining the door assembly in the closed position, wherein the actuator is configured within an actuator bore, the actuator bore configured within the vessel and coupled with the chamber, the actuator configured to move between a non-actuated position and an actuated position within the actuator bore, the actuator in the actuated position when a desired amount of pressure is applied to the actuator bore.

21. The closure assembly according to claim 20, wherein the actuator is configured to allow the door assembly to move from the closed position to the open position in response to a desired amount of pressure released from the chamber.

22. The closure assembly according to claim 21, wherein the vessel further comprises a pressure conduit coupled to the actuator, wherein the pressure conduit channels the pressure to the chamber and the actuator.

23. The closure assembly according to claim 22, further comprising a regulator valve positioned within the pressure conduit, wherein the regulator valve collects the desired amount of pressure within the pressure conduit to actuate the actuator before allowing the pressure to enter the chamber.

24. The closure assembly according to claim 20, wherein the door assembly further comprises:
   a. a door member for covering the access port in the first location; and
   b. an extendable member coupled to the door member, wherein the extendable member drives the door member between the open and closed positions.

* * * * *

UNITED STATES PATENT AND TRADEMARK OFFICE
CERTIFICATE OF CORRECTION

| | |
|---|---|
| PATENT NO. | : 7,001,468 B1 |
| APPLICATION NO. | : 10/353192 |
| DATED | : February 21, 2006 |
| INVENTOR(S) | : Alexei Sheydayi |

It is certified that error appears in the above-identified patent and that said Letters Patent is hereby corrected as shown below:

<u>Column 4,</u>
Line 24, change "iuner" to -- inner --.

<u>Column 9,</u>
Line 16, change "ill" to -- in --.

Signed and Sealed this

Twentieth Day of June, 2006

JON W. DUDAS
*Director of the United States Patent and Trademark Office*